United States Patent
Wieczorek et al.

(10) Patent No.: US 8,097,542 B2
(45) Date of Patent: Jan. 17, 2012

(54) ETCH STOP LAYER OF REDUCED THICKNESS FOR PATTERNING A DIELECTRIC MATERIAL IN A CONTACT LEVEL OF CLOSELY SPACED TRANSISTORS

(75) Inventors: Karsten Wieczorek, Dresden (DE); Manfred Horstmann, Duerrroehrsdorf-Dittersbach (DE); Peter Huebler, Coswig (DE); Kerstin Ruttloff, Hainichen (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 455 days.

(21) Appl. No.: 12/260,147

(22) Filed: Oct. 29, 2008

(65) Prior Publication Data

US 2009/0218629 A1    Sep. 3, 2009

(30) Foreign Application Priority Data

Feb. 29, 2008   (DE) .................. 10 2008 011 928

(51) Int. Cl.
*H01L 21/31* (2006.01)
(52) U.S. Cl. ..................... 438/783; 257/369
(58) Field of Classification Search .......... 438/783; 257/369
See application file for complete search history.

(56) References Cited

U.S. PATENT DOCUMENTS

| | | | |
|---|---|---|---|
| 6,573,172 B1 | 6/2003 | En et al. | 438/626 |
| 7,009,226 B1 | 3/2006 | Sun | 257/192 |
| 2003/0194874 A1* | 10/2003 | Ouchi | 438/710 |
| 2006/0261416 A1 | 11/2006 | Hachimine | 257/369 |
| 2007/0001233 A1 | 1/2007 | Schwan et al. | 257/369 |
| 2007/0161169 A1* | 7/2007 | Belyansky et al. | 438/197 |
| 2008/0026487 A1 | 1/2008 | Feustel et al. | 438/7 |
| 2008/0026572 A1 | 1/2008 | Wirbeleit et al. | 438/663 |
| 2008/0081480 A1 | 4/2008 | Frohberg et al. | 438/703 |
| 2008/0081481 A1 | 4/2008 | Frohberg et al. | 438/704 |

FOREIGN PATENT DOCUMENTS

| | | |
|---|---|---|
| DE | 102006046374 A1 | 4/2008 |
| WO | WO 2007/054403 A1 | 5/2007 |

OTHER PUBLICATIONS

Anonymous, "Structure and Method of Using Oxidized Silicon Nitride as an Etch-Stop Layer for Wet Chimistry Etching of Silicon Nitride", Sep. 4, 2003, PriorArtDatabase (www.ip.com), IPCOM000019209D.*
Translation of Official Communication from German Patent Office for German Patent Application No. 10 2008 011 928.8 dated Dec. 3, 2008.
PCT Search Report and Written Opinion from PCT/US2009/001287 dated May 28, 2009.

* cited by examiner

*Primary Examiner* — N Drew Richards
*Assistant Examiner* — Yu-Hsi D Sun
(74) *Attorney, Agent, or Firm* — Williams, Morgan & Amerson, P.C.

(57) ABSTRACT

In a dual stress liner approach, an intermediate etch stop material may be provided on the basis of a plasma-assisted oxidation process rather than by deposition so the corresponding thickness of the etch stop material may be reduced. Consequently, the resulting aspect ratio may be less pronounced compared to conventional strategies, thereby reducing deposition-related irregularities which may translate into a significant reduction of yield loss, in particular for highly scaled semiconductor devices.

20 Claims, 7 Drawing Sheets

ETCH STOP LAYER OF REDUCED THICKNESS FOR PATTERNING A DIELECTRIC MATERIAL IN A CONTACT LEVEL OF CLOSELY SPACED TRANSISTORS

BACKGROUND

1. Field of the Disclosure

Generally, the present disclosure relates to the field of integrated circuits, and, more particularly, to field effect transistors and manufacturing techniques on the basis of stressed dielectric layers formed above the transistors used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

Figure 1A:
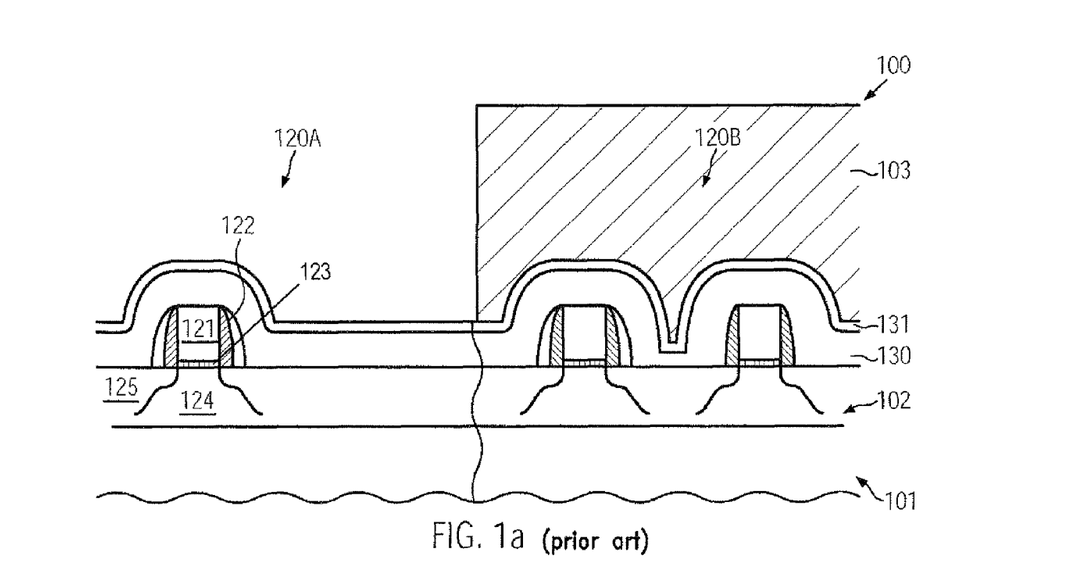
FIGS. 1a-1c schematically illustrate cross-sectional views of a semiconductor device during various manufacturing stages in forming differently stressed dielectric layers using an etch stop material between the differently stressed dielectric layers that is formed on the basis of deposition techniques which may result in deposition-related irregularities for device regions including densely spaced transistor elements.
Figure 1B:
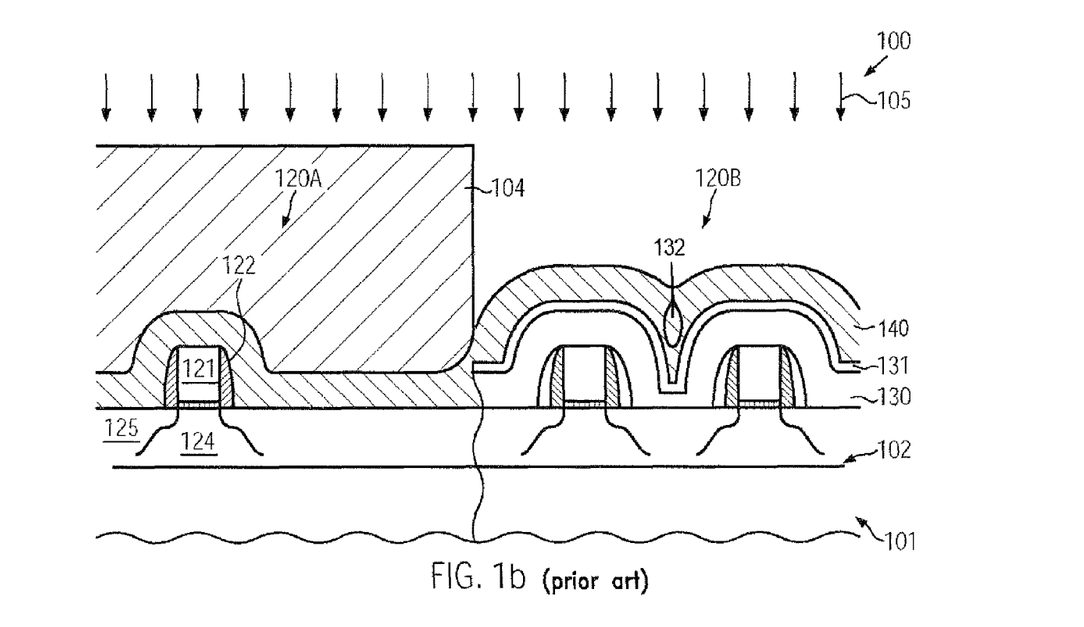
Figure 1C:
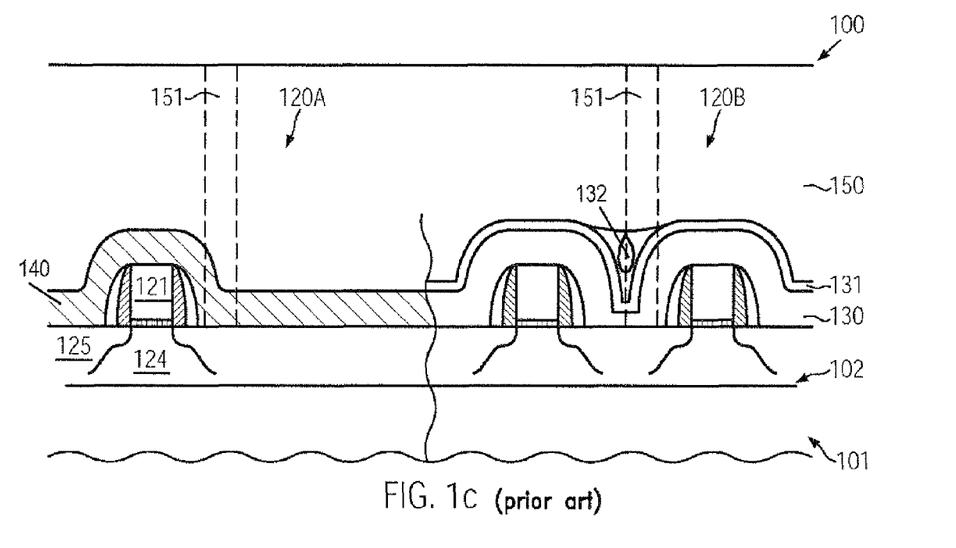

During the formation of the two types of stressed layers, conventional techniques may suffer from reduced efficiency when device dimensions are increasingly scaled by using the 45 nm technology and even further advanced approaches, due to the limited conformal deposition capabilities of the deposition processes involved, which may result in respective process non-uniformities during subsequent process steps for patterning the stressed layer and forming contact openings, as will be explained in more detail with reference to FIGS. 1a-1c.

FIG. 1a schematically illustrates a cross-sectional view of a semiconductor device 100 in a certain manufacturing stage for forming stress-inducing layers above a first device area 120A and a second device area 120B. The first and second device areas 120A, 120B, which typically represent respective transistor elements, may be formed above a substrate 101 comprising a semiconductor layer 102, such as a silicon-based layer, which may be separated from the substrate 101 by an appropriate buried insulating layer if a silicon-on-insulator (SOI) configuration is considered. In the example shown, the first and second device areas 120A, 120B may comprise a plurality of transistor elements with a lateral distance according to the design rules of the technology under consideration. The transistors in the first and second device areas 120A, 120B may comprise a gate electrode 121 formed on a respective gate insulation layer 123, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device, in which critical dimensions, such as the gate length, i.e., in FIG. 1a, the horizontal extension of the gate electrodes 121, may be approximately 50 nm or significantly less. Consequently, a distance between respective transistor elements, i.e., the lateral distance between neighboring sidewall spacer structures 122 of closely spaced transistor elements, as shown in the device region 120B, may be approximately 100 nm or even less.

It should be appreciated that the first and second device regions 120A, 120B may be separated by an appropriate isolation structure (not shown) if required. Furthermore, in the manufacturing stage shown in FIG. 1a, a silicon nitride layer 130, comprising, for instance, a high intrinsic tensile stress, is formed above the first and second device areas 120A, 120B, followed by an etch indicator layer 131 comprised of silicon dioxide. It should be appreciated that, if required, an etch stop layer, such as a silicon dioxide layer of appropriate thickness and density, may be provided between the silicon nitride layer 130 and the respective transistor elements in the first and second device areas 120A, 120B. The etch indicator layer 131 is typically provided with a thickness that is sufficient to stop an etch process in a later stage when patterning the layer 130, or to provide a pronounced endpoint detection signal. That is, a silicon nitride etch chemistry reacting with silicon dioxide results in a specific plasma ambient, which may be detected by standard detection techniques. Usually, a thickness of the etch indicator layer 131 is selected to be approximately 20 nm or more, thereby providing sufficient etch stop capabilities across the substrate in order to reliably control the respective etch process. In some approaches, the etch indicator layer 131 may act as a hard mask during the patterning of the silicon nitride layer 130.

As is evident from FIG. 1a, due to the reduced spacing between neighboring transistor elements, the silicon nitride layer 130 may have to be deposited with a moderately low thickness to take into consideration the gap fill capabilities of the deposition process, since, when the spacing between the transistor elements may be on the order of two times a layer thickness of the silicon nitride layer 130, the limited conformal fill behavior may result in corresponding defects, such as voids.

Furthermore, in this manufacturing stage, the semiconductor device 100 may comprise a resist mask 103, exposing the first device area 120A, while covering the second device region 120B. In this case, it may be assumed that the intrinsic stress of the silicon nitride layer 130 may be appropriately selected to enhance the transistor performance in the second device area 120B.

A typical process flow for forming the semiconductor device 100 as shown in FIG. 1a may comprise the following processes. The gate electrodes 121 and the gate insulation layers 123 may be formed and patterned on the basis of well-established process techniques, including advanced photolithography, deposition, oxidation and etch techniques. Thereafter, the drain and source regions 125 may be formed in combination with the sidewall spacer structures 122 on the basis of well-established deposition, anisotropic etch processes and implantation sequences in order to establish the desired vertical and lateral dopant profile. Thereafter, respective metal silicide regions may be formed, if required, on the basis of well-established techniques. Next, if required, a corresponding silicon dioxide etch stop layer may be formed, followed by the deposition of the silicon nitride layer 130. During the deposition of the silicon nitride material, respective process parameters, such as composition of carrier gases and reactive gases, substrate temperature, deposition pressure and in particular ion bombardment during the deposition, may significantly influence the finally obtained intrinsic stress of the material as deposited with respect to the underlying materials. Thus, by selecting appropriate parameter values, a high degree of intrinsic stress, such as up to 2 Gigapascal (GPa) and even more of compressive stress or up to 1 GPa or even significantly higher of tensile stress, may be created to enhance the performance of the transistor in the first device area 120A. Due to the less pronounced conformality of the silicon nitride deposition process above a certain layer thickness and for increased aspect ratios, as may occur in highly scaled devices, caused by the reduced distance between the neighboring transistor elements at moderately dimensioned gate heights in densely packed device areas, as shown, the thickness of the silicon nitride material is selected to avoid irregularities, such as voids. Thus, the deposition process for the silicon dioxide layer 131 may encounter an even more pronounced surface topography, thereby also requiring enhanced gap fill capabilities while avoiding increased oxide thickness and the creation of a void.

After the deposition of the silicon dioxide layer 131, the resist mask 103 may be formed on the basis of well-established photolithography techniques. Next, an appropriately designed etch process may be performed in order to remove a portion of the layers 130 and 131 from the device area 120A. During the corresponding etch process, the silicon dioxide material of the layer 131 may be removed first, followed by a selective etch process for removing the material of the silicon nitride layer 130, wherein the corresponding etch process may be controlled on the basis of an etch stop layer, if required.

FIG. 1b schematically illustrates the semiconductor device 100 at a further advanced manufacturing stage. As shown, a second dielectric layer 140 may be formed above the first and second device areas 120A, 120B, wherein a void 132 may be present in the second device area 120B, due to the limited gap filling capability of the deposition process for forming a highly stressed silicon nitride material and the pronounced surface topography previously created during the deposition of the layers 130, 131. That is, the aspect ratio of the space between the transistors in the device area 120B may be increased during the deposition of the layers 130 and 131. The void 132 in the second device region 120B may result in a reduced stress transfer mechanism, as well as degraded etch uniformity during the subsequent processing, thereby resulting in a significant yield loss.

Furthermore, at the manufacturing stage shown in FIG. 1b, a corresponding resist mask 104 is provided to protect the dielectric layer 140 during a corresponding etch process 105 for removing the exposed portion of the layer 140 in the second device region 120B.

With respect to the formation of the second dielectric layer 140, substantially the same criteria apply as previously explained with respect to the layer 130. Hence, during the deposition of the layer 140, respective process parameters may be adjusted in an appropriate manner so that a desired high intrinsic stress may be obtained. In sophisticated applications, i.e., in semiconductor devices of feature sizes of approximately 50 nm and less, the gap fill capabilities of the deposition process for forming the layer 140 may also play an important role for the etch process 105, since, in combination with the surface topography generated during the deposition of the layers 130 and 131, a substantially complete removal of the exposed portion of the layer 140 may depend on the deposition capabilities of the subsequent deposition for a given device geometry. Due to the creation of the void 132, the thickness of the layer 140 may be increased in the vicinity of the void, which may result in a non-sufficient removal of the material of the layer 140 during the process 105. Thus, the void 132 may be maintained after the process 105, thereby further contributing to increased yield loss during the further processing, due to contact failures.

FIG. 1c schematically illustrates the device 100 at a further advanced manufacturing stage, wherein a corresponding interlayer dielectric material 150, for instance comprised of silicon dioxide, may be formed above the first and second dielectric layers 130, 140. The dielectric material 150 may be formed on the basis of well-established techniques, such as sub-atmospheric deposition processes on the basis of TEOS, PECVD and the like, which may be followed by respective planarization processes, if required. Thereafter, respective contact openings 151 may be formed, which may, in some cases, for instance in dense RAM regions, connect to the device layer at areas located between respective closely spaced transistors. Thus, the corresponding void 132 may also affect the corresponding process, thereby resulting in less reliable contacts or even total contact failures.

As a consequence, upon further device scaling, the respective limitation of deposition processes for dielectric materials of high intrinsic stress may require a significant reduction of the layer thickness of the stress-inducing layers to comply with increased aspect ratios encountered in advanced device geometries. However, in this case, the respective strain induced by the stressed dielectric materials may also be significantly reduced, thereby also reducing transistor performance.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of increased yield losses in highly scaled transistor elements caused by non-uniformities during the patterning of contact openings in a strain-inducing mechanism using highly stressed dielectric layers in the contact level of the semiconductor devices. To this end, a technique may be provided in which the surface topography after the deposition of a first stress-inducing layer may be maintained less critical after the formation of an etch stop layer compared to conventional strategies, in which an etch stop layer may be formed by deposition techniques. For this purpose, the deposition of the etch stop material may be omitted and an efficient etch control or etch stop material may be provided by means of a plasma treatment in an oxidizing ambient to provide an oxidized surface portion of the previously deposited dielectric material with a significantly reduced thickness compared to conventional etch stop materials formed by deposition techniques. Thus, by providing the etch stop or etch control material with reduced thickness, the aspect ratio of the spacing between closely spaced transistor elements may be increased by a reduced amount compared to conventional techniques, while at the same time the degree of "conformality" of the plasma treatment may be enhanced compared to conventional deposition techniques, thereby also reducing the probability of creating surface irregularities in the etch stop or etch control material when compared to deposition techniques as are typically used. Consequently, a further dielectric material may be deposited with relaxed surface conditions compared to conventional strategies, thereby also reducing the probability of creating deposition-related irregularities, such as voids, which may therefore translate into reduced yield losses during the patterning of the second dielectric material, which may be efficiently removed by using the oxidized surface portion as an efficient etch stop or etch control material. In this manner, the applicability of a dual stress liner approach may be extended to device generations comprising transistor elements having a gate length of 50 nm and significantly less.

One illustrative method disclosed herein comprises forming a first dielectric layer above first and second transistors of a semiconductor device. The method further comprises forming an etch stop layer on the first dielectric layer at least above the first transistor by applying an oxidizing plasma ambient to oxidize a surface of the first dielectric layer. Moreover, the first dielectric layer is removed above the second transistor and a second dielectric layer is formed above the second transistor and on the remaining etch stop layer. Additionally, the method comprises selectively removing the second dielectric layer from above the first transistor by using the etch stop layer as an etch stop.

A further illustrative method disclosed herein comprises depositing a first stress-inducing layer above a plurality of first transistors and a plurality of second transistors. Furthermore, a surface portion of the first stress-inducing layer is oxidized to form an etch control layer. The method additionally comprises selectively removing the first stress-inducing layer and the etch control layer from above the plurality of second transistors and forming a second stress-inducing layer above the first and second transistors. Moreover, the method comprises selectively removing the second stress-inducing layer from above the plurality of first transistors by performing a removal process and using the etch control layer for controlling the removal process.

One illustrative semiconductor device disclosed herein comprises a plurality of first transistors and a second transistor. Moreover, a first dielectric layer is formed above and between gate electrode structures of the plurality of first transistors, wherein the first dielectric layer induces a first type of strain in the first transistors and has an oxidized surface portion. The semiconductor device further comprises a second dielectric layer formed above the second transistor, which induces a second type of strain in the second transistor, wherein the second type of strain differs from the first type of strain. Finally, the semiconductor device comprises an interlayer dielectric material formed on the oxidized surface portion and the second dielectric layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides methods and semiconductor devices based on a technique for providing stressed dielectric materials above the basic transistor structures, such as a dual stress liner approach, in which, after the deposition of a first stress-inducing material, the second stress-inducing material may be deposited on the basis of a less critical surface topography, compared to conventional strategies, by providing an etch stop or etch control material of reduced thickness and enhanced conformal characteristics, thereby reducing the probability of creating voids and other deposition-related surface irregularities which may, in conventional strategies, result in increased yield loss and/or reduced device performance. The reduced thickness and enhanced conformal behavior of the etch stop or etch control material may be accomplished by using a process technique providing per se enhanced conformal behavior while also providing a highly dense and efficient etch stop material in the form of a silicon dioxide-based composition. For this purpose, a plasma ambient may be established to efficiently oxidize a surface portion of the previously deposited dielectric material, which may be comprised of silicon nitride, thereby obtaining a layer thickness of the oxidized surface portion with a desired value in a highly controllable manner, while additionally the material characteristic may provide sufficient etch stop or etch control capabilities at a reduced thickness, which may be approximately 10 nm or less. Consequently, upon the formation of the oxidized surface portion in the form of an etch stop or etch control material, the spacing between the closely spaced gate electrode structures in sophisticated semiconductor devices may be reduced compared to conventional deposition processes, thereby increasing the resulting aspect ratio to a lesser extent compared to the conventional strategies. Therefore, subsequent deposition of a further stressed dielectric material may be performed with less critical process conditions, which may result in enhanced yield and performance.

Additionally, in some illustrative aspects, the controllability of the respective etch process may be enhanced by providing an indicator species, which may be appropriately incorporated into the oxidized surface portion to provide a prominent endpoint detection signal. For example, appropriate implantation or plasma treatment techniques may be used in order to incorporate the respective indicator species prior to or after oxidizing the surface portion of the previously deposited dielectric material, wherein even very "exotic" species may be used, such as metals and the like, in order to obtain an efficiently detectable endpoint detection signal while requiring only a minor concentration of the indicator species. In this manner, any influence caused by the process of incorporating the indicator species may be maintained at a low level while nevertheless providing enhanced controllability of the etch process.

Moreover, in still other illustrative aspects disclosed herein, the first dielectric material may be formed in combination with an etch stop material that may be obtained, at least locally, on the basis of an oxidizing plasma ambient, thereby also reducing the amount of non-stress-inducing dielectric material in the overall dielectric layer stack, wherein, in some illustrative embodiments, the oxidizing plasma treatment may be restricted to device areas in which the etch stop material may even be removed without causing significant damage to the underlying materials.

Figure 2A:
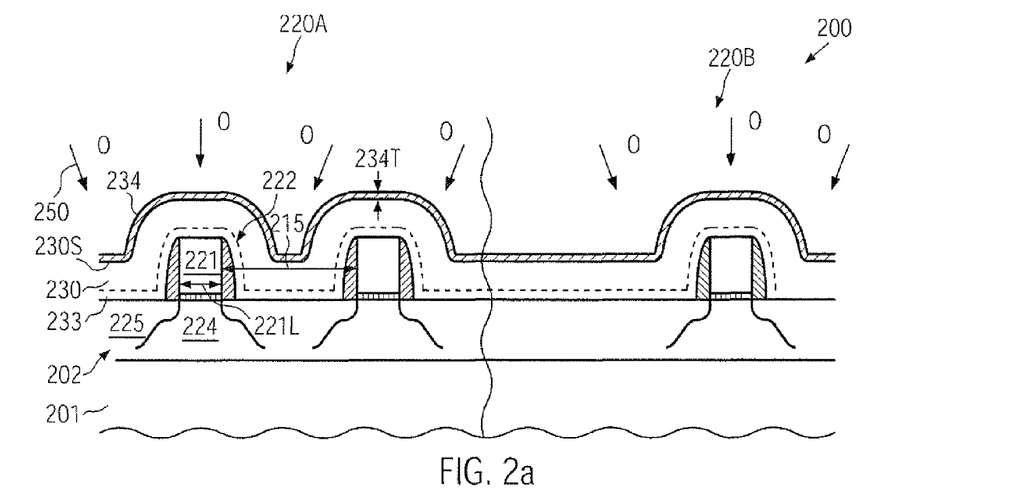
FIGS. 2a-2c schematically illustrate a semiconductor device including densely spaced transistor elements during various manufacturing stages in forming dielectric layers of different internal stress levels by using an etch stop or etch control material formed by an oxidizing plasma ambient, according to illustrative embodiments.

FIG. 2a schematically illustrates a cross-sectional view of a semiconductor device 200 which may comprise a substrate 201 above which is formed a semiconductor layer 202. In the semiconductor layer 202, a plurality of first transistors 220A and one or more second transistors 220B may be provided, wherein the first transistors 220A may represent closely spaced transistor elements which may, for instance, represent a RAM area of modern CPUs (central processing units), a memory device and the like. The first and second transistors 220A, 220B may comprise gate electrode structures 221 formed above channel regions 224 that are laterally enclosed by drain and source regions 225. The transistors 220A and 220B may have the same or a similar configuration as is described with reference to the device 100. The gate electrodes may have a gate length 221L of approximately 50 nm and less, for example 30 nm and less, as may be the case for semiconductor devices according to the 45 nm technology node. Consequently, a distance 215 for spaces between neighboring gate electrode structures 221 of the closely spaced transistors 220A may be several hundred nanometers and less, wherein the actual spacing may be determined by the width and configuration of respective sidewall spacer structures 222. For example, the distance between neighboring spacer structures may be 100 nm and less for highly sophisticated devices.

The semiconductor device 200 may further comprise a stress-inducing dielectric layer 230, for instance comprised of silicon nitride, as previously explained, wherein the layer 230 may have any appropriate internal stress level so as to induce a desired type of strain in channel regions of one type of the transistors 220A and 220B. For example, in the embodiment shown, it may be assumed that the transistors 220A may represent N-channel transistors, while the transistor 220B may represent a P-channel transistor. It may further be assumed that the layer 230 is provided to enhance performance of the transistors 220A. In this case, the layer 230 may exhibit a high internal tensile stress level, which may result in enhanced transistor performance, as previously described. It should be appreciated that, in other cases, the layer 230 may be provided so as to exhibit a high compressive stress level to enhance performance of the transistor 220B. Furthermore, an etch stop layer 233 may be provided, if required, which may be comprised of silicon dioxide, with an appropriate thickness and density to appropriately protect underlying material layers, for instance, of the transistor 220B when removing the layer 230 in a later manufacturing stage.

With reference to any manufacturing techniques and characteristics and components described so far, it may be referred to the description with respect to the device 100 and hence any further details may be omitted here. Thus, after the deposition of the layer 230 on the basis of well-established techniques, the semiconductor device 200 may be exposed to an oxidizing plasma ambient 250, which may be established in any appropriate process tool, such as a deposition tool, a plasma etch tool and the like. The plasma ambient 250 may be established on the basis of appropriate process conditions, such as the flow rate of oxygen and other carrier gases, in order to obtain a desired process pressure in the ambient 250, which may range from several hundred mTorr to several Torr, depending on the overall process strategy. Appropriate process parameters for determining a desired oxidation rate for a specified base material, such as silicon nitride, in a highly stressed state may be obtained by experiment, wherein at least one process parameter for establishing the ambient 250 may be varied and a corresponding process result may be monitored. Similarly, the material characteristics of a surface portion that may be in contact with the plasma-assisted ambient 250 may be determined, for instance, in view of etch resistance by creating material sample for various process conditions of the ambient 250 and determining respective etch rates with respect to an etch recipe that may be used for patterning a dielectric material, wherein an oxidized surface portion of the layer 230 is to be used as an etch stop or etch control material. Furthermore, in some illustrative embodiments, the overall process temperature during establishing the ambient 250 may be maintained within a temperature range that may be compatible with the material characteristics of the device 200 in the manufacturing stage as shown in FIG. 2a. That is, frequently, metal silicide regions may be formed in the transistors 220A, 220B which may experience a material modification upon exposure to higher temperatures. Thus, in some illustrative embodiments, the oxidizing plasma ambient 250 may be established with temperatures of approximately 400° C. and less. It should be appreciated that a respective process temperature is to be understood as a temperature that may be applied to the substrate 201 during establishing the ambient 250 such that it may be assumed that the device 200 is substantially in an equilibrium state so that only insignificant temperature gradients and thus a different temperature at the layer 230 may be observed during the process 250. In other cases, the surface temperature of the layer 230 may be considered as the respective process temperature and may be in the above-specified range. Consequently, upon exposing the device 200 to the oxidizing plasma-assisted ambient 250, the surface 230S of the layer 230 may come into contact with the oxygen and may be converted in an oxidized material, which may comprise silicon, nitrogen and oxygen. Depending on the process parameters used, a respective etch stop or etch control layer 234 may, therefore, be formed in a highly conformal manner in and on the layer 230. Due to the enhanced density caused by the plasma ambient 250, the layer 234 may be provided with a reduced thickness compared to conventional etch stop material in the form of deposited silicon dioxide so that the aspect ratio of the space between the closely spaced gate electrodes 221 of the transistors 220A may be increased to a lesser amount compared to conventional strategies. For instance, a thickness 234T of the layer 234 may be approximately 10 nm and less, such as 5 nm and less.

Figure 2B:
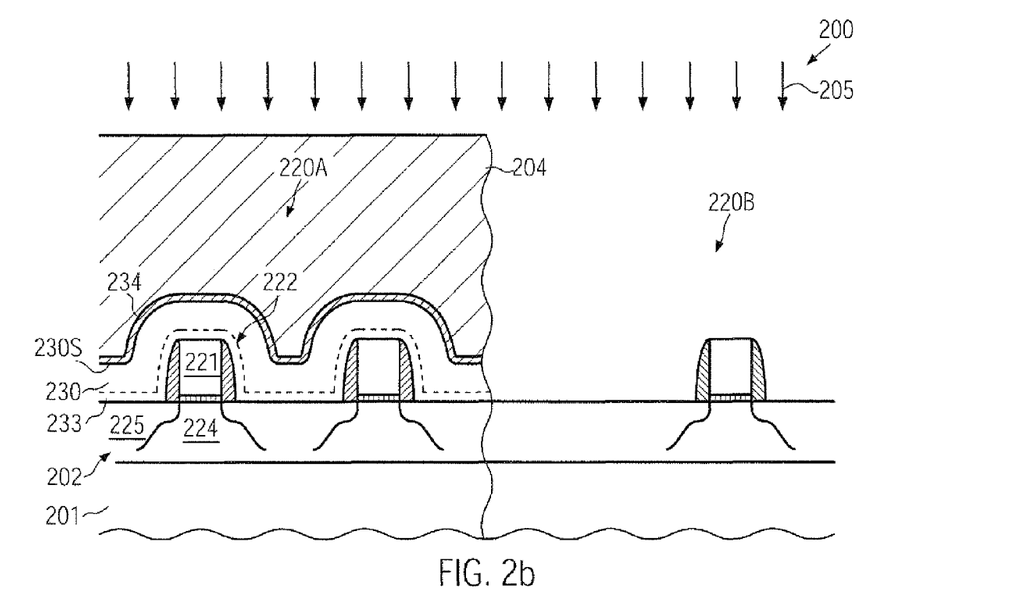

FIG. 2b schematically illustrates the semiconductor device 200 in a further advanced stage, in which a resist mask 204 may be formed above the transistors 220A while exposing the transistor 220B, in which a different type of strain may have to be created to enhance performance of the transistor 220B. To this end, the device 200 may be subjected to an etch process 205, which may include a first etch step for etching through the exposed portion of the layer 234, followed by an etch step for selectively removing the material of the layer 230, wherein, for instance, the etch stop layer 233 may be used for controlling the etch process, if required. Thereafter, the residues of the etch stop layer 233 may be removed on the basis of highly selective wet chemical etch recipes, substantially without negatively affecting any underlying materials, such as metal silicide (not shown) and the like.

Figure 2C:
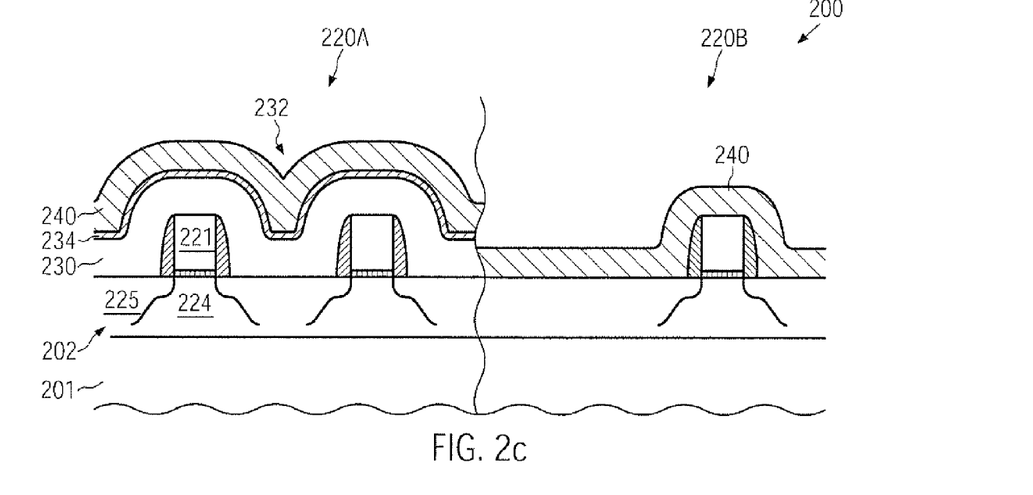

FIG. 2c schematically illustrates the semiconductor device 200 in a further advanced manufacturing stage in which a second dielectric layer 240 may be formed above the first transistors 220A and the second transistor 220B. As previously explained, the dielectric layer 240 may have a high internal stress level to enhance performance of the transistor 220B. During the deposition of the layer 240, the previously formed surface layer 234 may provide an enhanced surface topography compared to conventional strategies, as for instance explained with reference to FIGS. 1a-1c, so that the probability of creating deposition-related surface irregularities in the critical device region 232 may be reduced compared to conventional process techniques. Furthermore, due to the reduced thickness of the surface layer 234, the initial thickness of the layer 230 and/or the thickness of the layer 240 may be increased as long as the additional thickness may be compatible with the gap fill capabilities of the respective deposition processes. That is, since a significant "savings" in material with respect to the etch stop layer 234 may be achieved compared to conventional strategies, a part of the savings may be "sacrificed" for the benefit of an increased thickness of the layer 230 and/or 240.

Thereafter, the further processing may be continued, as previously described with reference to the device 100, that is, a resist mask may be formed above the transistor 220B so as to expose the transistors 220A to remove the exposed portion of the layer 240 on the basis of well-established etch recipes. During the etch process, enhanced process uniformity may be achieved due to the significant reduction of deposition-related irregularities, as previously explained, while also the plasma oxidized surface layer 234 may provide the desired etch stop capabilities. Hence, after forming an interlayer dielectric material, for instance in the form of silicon dioxide and the like, the patterning thereof, as well as the opening of the layers 230 and 240, may be accomplished on the basis of enhanced process uniformity, thereby reducing the probability of creating contact failures even for densely packed devices, such as transistors 220A.

Figure 2D:
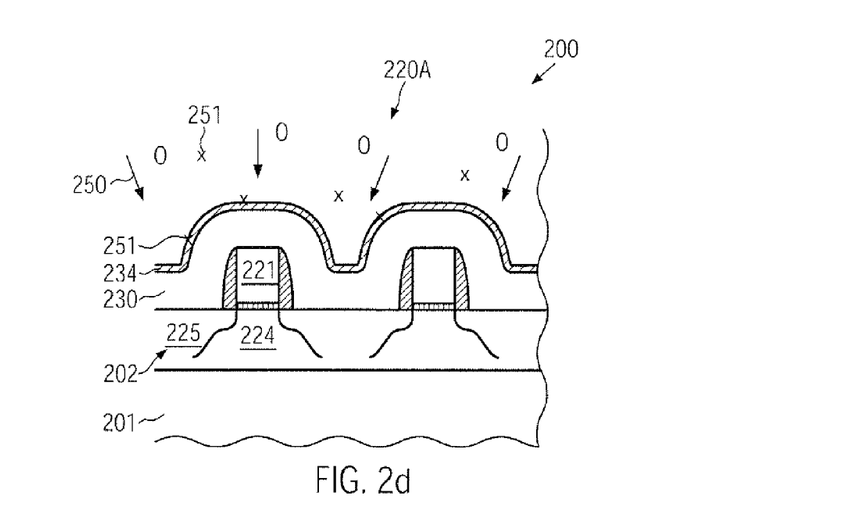
FIGS. 2d-2f schematically illustrate cross-sectional views of a semiconductor device during the formation of an oxidized surface portion of a stressed dielectric material while also including an etch indicator species for obtaining a pronounced endpoint detection signal, according to further illustrative embodiments.
Figure 2E:
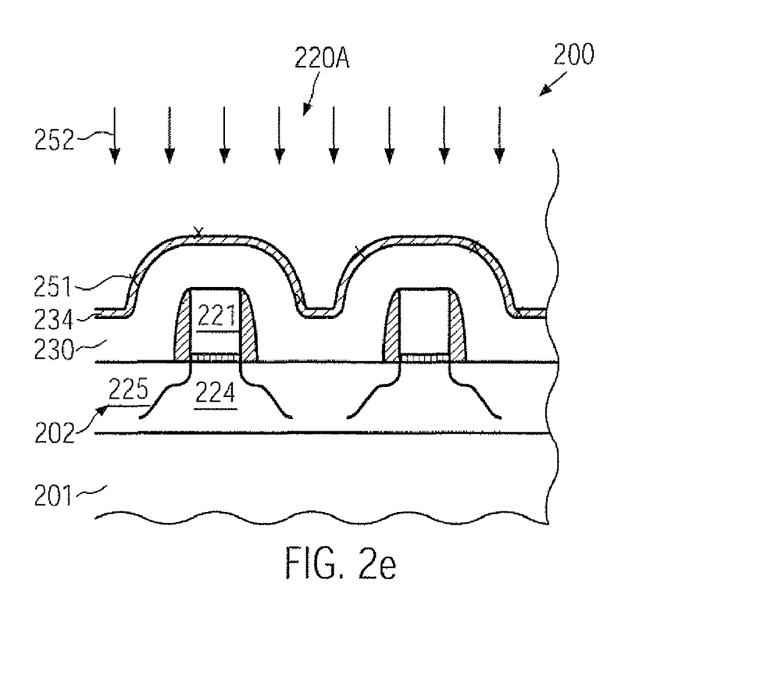
Figure 2F:
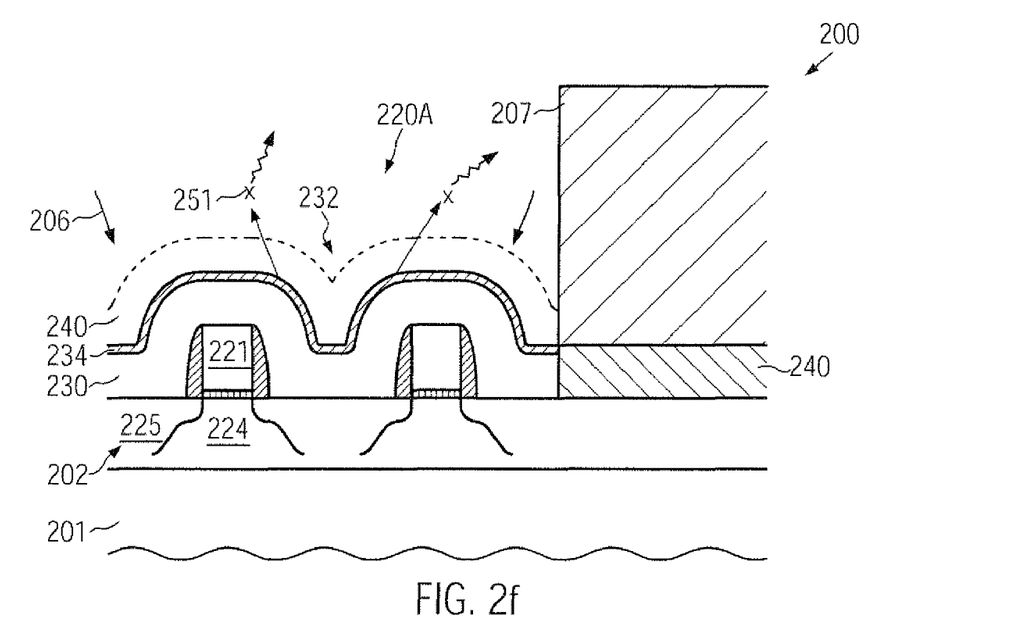

With reference to FIGS. 2d-2f, further illustrative embodiments will now be described in which, in addition to the plasma-assisted oxidation process, a prominent etch indicator species may be incorporated into the layer 234 to further enhance the overall control of the etch process.

FIG. 2d schematically illustrates the transistors 220A of the device 200 when exposed to the oxidizing plasma ambient 250, which may also include an etch indicator species 251, which may be provided in the form of any appropriate species, such as metal atoms, which may result in a prominent optical signal upon release during an etch process in which the layer 234 may act as an etch stop layer. Thus, during the plasma treatment 250, ions of the species 251 may be incorporated into the layer 234, however, at a moderately low concentration which may be sufficient for obtaining a desired endpoint detection signal.

FIG. 2e schematically illustrates the semiconductor device 200 according to further illustrative embodiments in which a separate treatment 252 may be formed to incorporate the etch indicator species 251 into the layer 234. For example, the treatment 252 may comprise a plasma treatment performed on the basis of any appropriate carrier and reactive gas component, wherein the species 251 may be present in a specific concentration so as to obtain a desired "doping level" in the layer 234. In other illustrative embodiments, the treatment 252 may comprise a low energy implantation process in which a wide variety of indicator species may be applied where concentration and penetration depth may be controlled in a reliable manner by appropriately selecting the implantation parameters. It should be appreciated that, in some illustrative embodiments, the etch indicator species 251 may be incorporated into the surface portion 234 of the layer 230 prior to performing the oxidizing plasma treatment 250.

FIG. 2f schematically illustrates the semiconductor device 200 during an etch process 206 performed on the basis of a resist mask 207 so as to selectively remove the layer 240 from the transistors 220A. Thus, upon exposing the etch stop or etch control layer 234, increasingly the etch indicator species 251 may be released, thereby producing a pronounced optical spectrum, which may be detected by appropriate endpoint detection systems, as are typically used for performing plasma-assisted etch processes. Thus, even for a reduced thickness of the layer 234, reliable control and thus endpoint of the etch process 206 may be determined, even if a significant material removal of the layer 234 may occur.

Figure 3A:
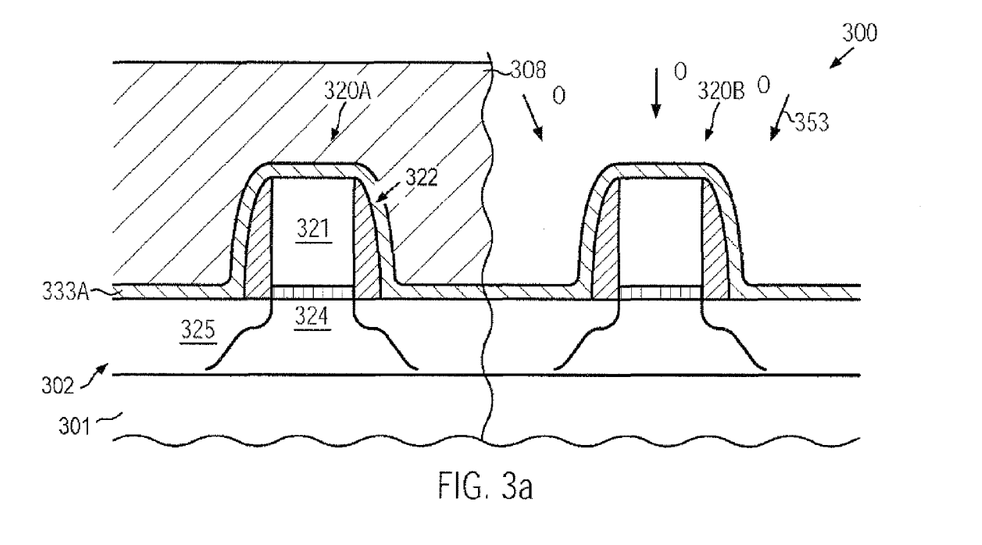
FIGS. 3a-3c schematically illustrate cross-sectional views of a semiconductor device during various manufacturing stages in forming differently stressed dielectric materials, wherein a basic etch stop layer may be provided on the basis of a plasma-assisted oxidation process, according to still other illustrative embodiments.
Figure 3B:
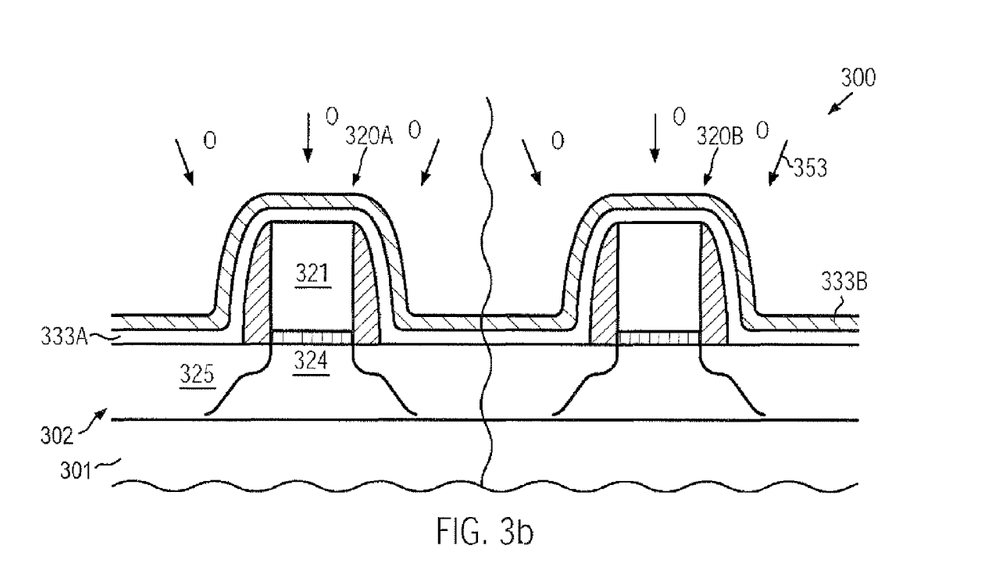
Figure 3C:
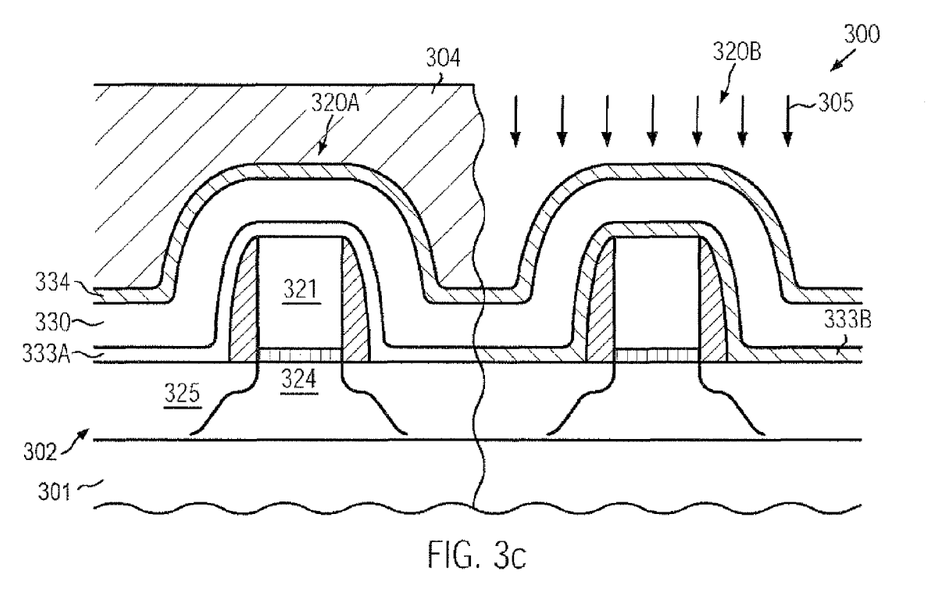

With reference to FIGS. 3a-3c, further illustrative embodiments will now be described in more detail, in which a plasma-based oxidation process may be used for forming an etch stop layer prior to the deposition of the first stress-inducing dielectric material.

FIG. 3a schematically illustrates a semiconductor device 300 comprising a first transistor 320A and a second transistor 320B. The transistors 320A, 320B are formed in and above a semiconductor layer 302 which in turn is provided above a substrate 301. The transistors 320A, 320B may comprise a gate electrode structure 321, a spacer structure 322, a channel region 324 and drain and source regions 325. For these components, the same criteria apply as previously explained with reference to the devices 100 and 200. Furthermore, in the manufacturing stage shown, the device 300 may be exposed to an oxidizing plasma ambient 353, which, in the embodiment shown, may selectively act on the transistor 320B, while a mask 308 may protect the transistor 320A. Furthermore, a dielectric material 333A may have been deposited on the transistors 320A, 320B, wherein, in one illustrative embodiment, the material 333A may represent a highly stressed dielectric material with an internal stress level selected to enhance performance of the transistor 320A. For example, a silicon nitride layer with compressive or tensile stress may be used. Consequently, during the plasma-assisted oxidation process 353, at least a significant portion of the material 333A may be converted into oxidized material having the desired etch stop capabilities for removing a silicon nitride material in a later manufacturing stage. With respect to the oxidizing plasma ambient 353, the same criteria apply as previously explained with reference to the plasma ambient 250.

FIG. 3b schematically illustrates the device 300 according to further illustrative embodiments, in which the oxidizing plasma 353 may be applied without providing a mask. For instance, the layer 333A may be provided with an appropriate thickness and with a desired internal stress level so that the transistor 320A may be in immediate contact with a stress-inducing material. Thereafter, the treatment 353 may be performed in order to create a surface layer 333B having the desired etch stop capabilities, as previously explained. Thus, also in this case, the overall stress transfer mechanism may be enhanced in the transistor 320A, since the etch stop layer 333B may be provided with reduced thickness compared to a conventional etch stop layer, as is, for instance, referred to in FIG. 2a in the form of the layer 233, while, in the embodiment shown in FIG. 3a, the presence of a less stress-efficient etch stop material above the transistor 320A may be completely avoided.

FIG. 3c schematically illustrates the device 300 in a further advanced manufacturing stage, in which a stressed dielectric layer 330, in combination with a surface layer 334, may be provided above the transistors 320A, 320B. Furthermore, a resist mask 304 may be provided to cover the transistor 320A and expose the transistor 320B to an etch ambient 305. The layer 330 may be formed according to any deposition techniques, as previously explained, followed by a plasma-assisted oxidation process, such as the process 353, 250 as previously explained. Consequently, in the transistor 320A, the layers 333A and 330 may provide a high stress level, while, in the transistor 320B, the layer 333B may act as an efficient etch stop material during the etch process 305. Hence, during a first step of the process 305, the exposed portion of the layer 334 may be removed and thereafter the etch chemistry may be appropriately selected to etch the exposed portion of the layer 330, while the material 333B may reliably stop the etch front upon exposure. Thereafter, the further processing may be continued, as previously described with reference to the devices 100 and 200.

As a result, the present disclosure provides semiconductor devices and methods for forming the same, in which deposition-related irregularities during the formation of stressed dielectric materials above transistor devices may be reduced by providing a less pronounced increase of aspect ratio in densely packed device regions by forming an intermediate etch stop layer on the basis of an oxidizing plasma ambient. For this purpose, after the deposition of a first dielectric material, a plasma ambient may be established to oxidize a surface portion thereof, which may substantially avoid deposition-related irregularities, as may be the case in conventional techniques, in which a respective etch stop material may be deposited by techniques such as chemical vapor deposition (CVD) and the like. Furthermore, due to the plasma ambient, enhanced etch stop capabilities may be achieved at a reduced layer thickness, thereby further enhancing the overall process uniformity. Hence, the application of strain-inducing mechanisms on the basis of providing highly stressed dielectric material above the transistor structures may be extended to advanced technology nodes, such as the 45 nm technology and beyond, while avoiding undue yield losses, as may be the case in conventional strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first dielectric layer above first and second transistors of a semiconductor device;
   forming an etch stop layer on said first dielectric layer at least above said first transistor by exposing said first dielectric layer to an oxidizing plasma ambient so as to oxidize a surface of said first dielectric layer;
   prior to forming said first dielectric layer, forming a third dielectric layer above said first and second transistors, forming a patterned mask layer above said semiconductor device to cover said first transistor and to expose at least a first portion of said third dielectric layer formed above said second transistor, and exposing said semiconductor device to a further oxidizing plasma ambient so as to oxidize at least a surface portion of said at least said first portion;
   removing portions of said first dielectric layer positioned above said second transistor;
   forming a second dielectric layer above said second transistor and on said etch stop layer; and
   selectively removing said second dielectric layer from above said first transistor by using said etch stop layer as an etch stop.

2. The method of claim 1, wherein forming said first dielectric layer comprises depositing a dielectric material with an internal stress level for inducing a strain in a channel region of said first and second transistors.

3. The method of claim 2, wherein said dielectric material of said first dielectric layer comprises silicon nitride with an internal tensile stress level.

4. The method of claim 3, wherein said second dielectric layer is deposited with an internal compressive stress level so as to induce compressive strain in a channel region of said second transistor.

5. The method of claim 1, wherein a gate length of gate electrodes of said first and second transistors is approximately 50 nm or less.

6. The method of claim 1, wherein said oxidizing plasma ambient is applied at a process temperature of approximately 400° C. or less.

7. The method of claim 1, further comprising incorporating an etch indicator species into said etch stop layer prior to forming said second dielectric layer.

8. The method of claim 7, wherein said etch indicator species is incorporated by performing a plasma treatment.

9. The method of claim 7, wherein said etch indicator species is incorporated by performing an ion implantation process.

10. The method of claim 1, wherein removing portions of said first dielectric layer positioned above said second transistor comprises using said at least said first portion of said third dielectric layer as an etch stop.

11. The method of claim 1, wherein forming said third dielectric layer comprises depositing a dielectric material with an internal stress level for inducing a strain in a channel region of at least said first transistor.

12. A method, comprising:
    depositing a first stress-inducing layer above a plurality of first transistors and a plurality of second transistors;
    oxidizing a surface portion of said first stress-inducing layer so as to form an etch control layer;
    prior to depositing said first stress-inducing layer, depositing a third stress-inducing layer above said pluralities of first and second transistors, forming a patterned mask layer to cover said plurality of first transistors and to expose said plurality of second transistors, and oxidizing at least a surface portion of at least a portion of said third stress-inducing layer formed above said plurality of second transistors to form a further etch control layer;
    selectively removing said first stress-inducing layer and said etch control layer from above said plurality of second transistors;
    forming a second stress-inducing layer above said first and second transistors; and
    selectively removing said second stress-inducing layer from above said plurality of first transistors by performing a removal process and using said etch control layer for controlling said removal process.

13. The method of claim 12, wherein oxidizing said surface portion of the first stress-inducing layer is performed in an oxidizing plasma ambient.

14. The method of claim 13, wherein said plasma ambient is established at a process temperature of approximately 400° C or less.

15. The method of claim 12, wherein said etch control layer is formed so as to have a thickness of less than approximately 10 nm.

16. The method of claim 12, wherein said first stress-inducing layer comprises silicon nitride.

17. The method of claim 12, wherein said first stress-inducing layer has an internal tensile stress level.

18. The method of claim 12, wherein said first stress-inducing layer has an internal compressive stress level.

19. The method of claim 12, wherein selectively removing said first stress-inducing layer and said etch control layer from above said plurality of second transistors comprises performing a further removal process and using said further etch control layer for controlling said further removal process.

20. The method of claim 12, wherein depositing said first stress-inducing layer above said plurality of first transistors comprises depositing said first stress-inducing layer above at least a first gate electrode comprising a first sidewall and a second gate electrode comprising a second sidewall that is adjacent to said first sidewall, and wherein said second sidewall is laterally spaced approximately 100 nm or less from said first sidewall.

* * * * *